United States Patent [19] [11] Patent Number: 4,745,274
Muro [45] Date of Patent: May 17, 1988

[54] SEMICONDUCTOR LIGHT DETECTING INTEGRATED CIRCUIT

[75] Inventor: Hideo Muro, Yokohama, Japan

[73] Assignee: Nissan Motor Co., Ltd., Kanagawa, Japan

[21] Appl. No.: 918,124

[22] Filed: Oct. 14, 1986

[30] Foreign Application Priority Data

Oct. 17, 1985 [JP] Japan ................................ 60-229933

[51] Int. Cl.⁴ .............................................. H01J 39/12
[52] U.S. Cl. .............................. 250/214 R; 250/214 C; 307/311
[58] Field of Search ..................... 250/214 R, 214 C; 307/311

[56] References Cited

U.S. PATENT DOCUMENTS 3,770,967 11/1973 Hanna et al. ......................... 307/311
3,770,968 11/1973 Hession et al. .................. 250/214 R
4,328,419 5/1982 Lefebvre ........................... 250/214 R Primary Examiner—Edward P. Westin
Assistant Examiner—Khaled Shami
Attorney, Agent, or Firm—Foley & Lardner, Schwartz, Jeffery, Schwaab, Mack, Blumenthal & Evans

[57] ABSTRACT

A semiconductor light detecting integrated circuit comprises a light detecting element, a constant current source having a first FET connected in series to the light detecting element and a power source, the constant current source having a region in which a constant current flows through the first FET, and an electrical circuit having a second FET the gate of which is connected to a connecting point between the light detecting element and the constant current source, the electrical circuit providing a two-valued output for the gate voltage at the connecting point generated according to whether or not the output current of the light detecting element reaches a predetermined current set in the constant current region of the constant current source.

3 Claims, 2 Drawing Sheets

FIG. I
PRIOR ART
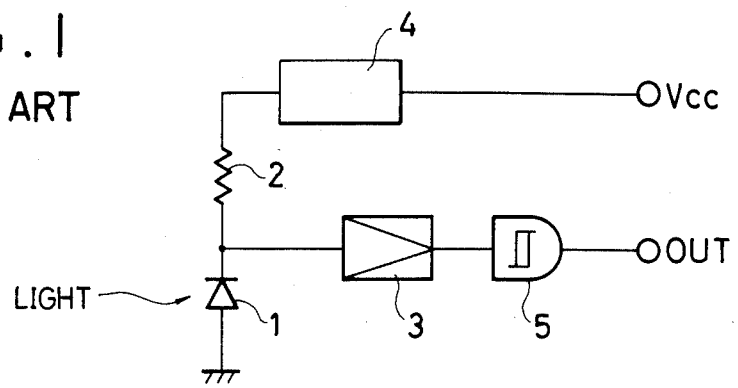
FIG. 2
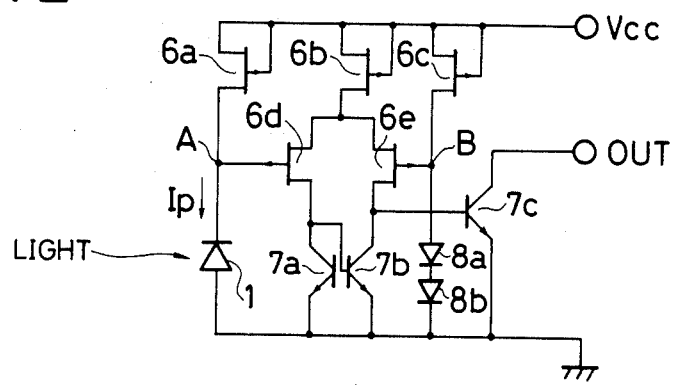
FIG. 4
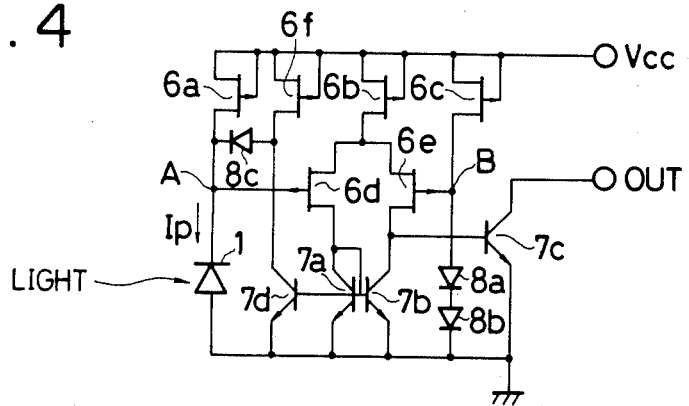

4,745,274

SEMICONDUCTOR LIGHT DETECTING INTEGRATED CIRCUIT

BACKGROUND OF THE INVENTION

1. Field of the Invention

This invention relates to a semiconductor device comprising a light detecting element and a periphery circuitry for discriminating an output level of the light detecting element, the element and the circuitry being formed integrally in a single semiconductor layer.

2. Prior Art of the Invention

There have been known a light detecting circuitry formed on a semiconductor substrate, as shown in Japanese Laid-Open Pat. No. 58-170077 for example.

In FIG. 1 showing such a conventional circuitry, a semiconductor light detecting integrated circuit comprises a photo diode 1 as a light receiving element, a load resistance 2 for converting the output current of the photo diode 1 into a voltage signal, a DC amplifier 3 for amplifying the light detecting signal of the photo diode 1 converted to the voltage by the load resistance 2, a bias circuit 4 for setting the bias level for the DC amplifier 3 and a Schmitt trigger circuit 5 for converting the output signal of the DC amplifier 3 into a two-valued or binary signal using a reference signal thereof.

The photo diode 1 may be formed using a bipolar structure in which a pn junction is formed between a p-type silicon substrate and an n-type epitaxial layer. The resistance 2 has several hundreds Ω to one mege Ω and is formed by implantation of boron ion into the n-epitaxial layer as a sheet resistance having about 5 KΩ/cm².

However, in such a conventional circuit, the output current of the photo diode is converted into a voltage signal by the high resistance and further amplified by the DC amplifier, thereby providing a two-valued output. Therefore, the conventional circuitry requires a large number of cells such as 40–50 elements and occupies a large area on the semiconductor substrate. Especially the problem is the large occupied area of the high resistance on the semiconductor chip. For instance, a 500 K Ω resistance requires a large area of about 150 μm × 300 μm.

Furthermore, as the output current of the photo diode is converted to a DC voltage signal using the high resistance and amplified by the DC amplifier to produce a two-valued or binary output signal, the bias level is simultaneously amplified during the amplification, making the sensitivity of the circuitry fluctuating and the characteristics of the circuitry greatly depending on the temperature thereof.

SUMMARY OF THE INVENTION

An object of the present invention is to provide a semiconductor light detecting integrated circuit in which the integrated circuit is simple and has a small occupied area therefor and the light detecting level is not fluctuated and does not depend on the temperature of the circuit.

With the above object in view, the present invention resides in a semiconductor light detecting integrated circuit comprising a light detecting element, a constant current source having a first FET connected in series to the light detecting element and a power source, said constant current source having a region in which a constant current flows through the first FET, and electrical means having a second FET the gate of which is connected to a connecting point between the light detecting element and the constant current source, said electrical mean providing a two-valued output for the gate voltage at said connecting point generated according to whether or not the output current of the light detecting element reaches a predetermined current set in said constant current region of the constant current source.

BRIEF DESCRIPTION OF THE DRAWINGS

FIG. 1 is a block diagram showing a conventional semiconductor light detecting circuit;

FIG. 2 is an equivalent circuit of a semiconductor light detecting integrated circuit in an embodiment of the invention;

FIG. 4 is a circuit diagram in another embodiment of the invention.

DETAILED DESCRIPTION OF THE PREFERRED EMBODIMENTS

Figure 3:
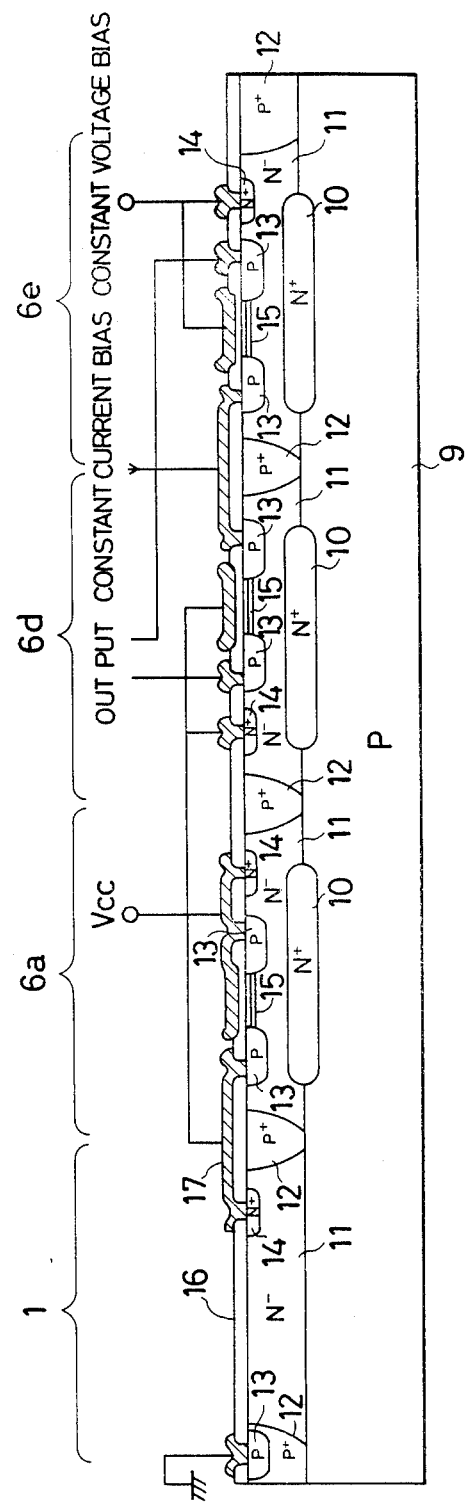
FIG. 3 is a partially cross-sectional view of a main portion of the circuit of FIG. 2.

An equivalent circuit of a semiconductor light detecting integrated circuit in FIG. 2 of the present invention comprises a photo diode 1, five p channel junction type FETs (referred to as JFET hereinafter) 6a to 6e, three npn transistors 7a to 7c and two diodes 8a and 8b. The JEFTs 6a, 6b and 6c have sources respectively short-circuited to the gates thereof and connected to an electric power source, functioning as constant current sources respectively.

The JFET (constant current source) 6a and the photo diode 1 are connected in series to each other between the power source and the earth with their connection point A connected to the gate of the JFET 6d. The JFETs 6d and 6e constitute a differential input pair. The sources of the JFETs 6d and 6e are connected to the drain of the JFET 6b and both drains of the JFETs 6d and 6e are earthed through a current mirror circuit composed of the npn transisters 7a and 7b.

On the other hand, the JFET (constant current source) 6c and the pair of diodes 8a and 8b are connected in series to each other between the power source and the earth with their connecting point B connected to the gate of the JFET 6e. By the forward voltage drop through the pair of diodes 8a and 8b, a predetermined voltage is generated at point B and is applied to the gate of the JFET 6e. The base of the npn transistor 7c is connected to the drain of the JFET 6e to generate an output signal from the open collector of the transistor 7c.

The JFET 6a in which the source and the gate are short-circuited to each other to form a constant current source exhibits a constant current characteristics when the source-drain voltage $V_{DS}$ is larger than the pinch-off voltage, and at this time keeps the drain current at the maximum saturation current $I_{DSS}$. When the source-drain voltage $V_{DS}$ is smaller than the pinch-off voltage, the JFET 6a functions as a resistance and its drain current is approximately proportional to the voltage $V_{DS}$.

When light is irradiated to the photo diode 1 connected in series to the JFET 6a, an electric current Ip flows through the photo diode 1 and the JFET 6a corresponding to the light quantity level of the photo diode 1. When the current Ip is smaller than the maximum saturation current $I_{DSS}$ of the JFET 6a and therefore is below the constant current range of the JFET 6a, the voltage at point A remains relatively high although this voltage is reduced approximately in proportion to the current Ip. When the current Ip increases to a level approximately equal to the maximum saturation current $I_{DSS}$ and therefore has reached the constant current range of the JFET 6a, the voltage at connecting point A rapidly decreases approximately to the earth level.

As described above, the voltage at point A rapidly changes according to whether or not the current Ip reaches the level of the maximum saturation current $I_{DSS}$, and is applied to the gate of the JFET 6d having a very high input impedance.

When the current Ip reaches the maximum saturation current $I_{DSS}$, the voltage at point A rapidly decreases and becomes lower than the voltage at point B. The JFET 6d and the npn transistors 7a and 7b are thus turned on and the npn transistor 7c is turned off. On the other hand, when the current Ip is smaller than the maximum saturation current $I_{DSS}$, the JFET 6d and the npn transistors 7a and 7b are turned off and the npn transistor 7c is turned on.

As can be understood from the above, in the circuit according to the invention, the light detecting level of the photo diode 1 can be two-valued with reference to the maximum saturation current $I_{DSS}$ of the JFET 6a. The current $I_{DSS}$ can be accurately controlled by suitably choosing the size and the resistivity of the channel region of the JFET 6a. In addition, the maximum saturation current $I_{DSS}$ almost does not depend on the temperature of the circuit since the temperature coefficients of the depletion layer width and the mobility of the channel region are negative.

Further, the sensitivity of the photo diode 1 affects the discrimination accuracy of the current $I_{DSS}$ but can be easily made high by controlling the thickness and the doping amount of the n-epitaxial layer. In FIG. 3, the structure and the production method of an integrated circuit according to the invention will be next described.

FIG. 3 shows a p-type silicon substrate 9, n+ buried layers 10, an n− epitaxial layer 11, p+ isolating diffused regions 12, p− source diffused regions 13, n+ emitter diffused regions 14, boron ion implanted regions 15, a silicon oxide film 16 and aluminum wirings 17.

In manufacturing an integrated circuit of the present invention, first, n+ buried layers 10 are formed on the p-type silicon substrate 9 and n− epitaxial layers 11 are then formed on the n+ buried layers 10 and the substrate 9 by epitaxial growth. Next p+ isolating diffused layers 12 are formed by diffusion in the epitaxial layer 11 to divide it into a plurality of sections and within each section p-type base diffused regions 13 and n+ emitter diffused regions 14 are formed. Then, some portions of the silicon oxide film 16 corresponding to the channels of the JFETs are removed by etching and boron ions are implanted into the removed portions of the silicon oxide film 16. The ion implantation is made under the condition in which when the accelerated energy is 100 KeV and the implanted amount is 0.6-$2 \times 10^{12}$ atoms/cm$^2$, a p-type channel region having effective doping amount $10^{16}$–$10^{17}$ atoms/cm$^3$ is formed to the depth 1000 Å or more from the interface between the epitaxial layer 11 and the silicon oxide film 16. The silicon oxide film 16 having about 1000 Å thickness is next formed on the channel region by a WET oxidation. Next contact holes are formed by etching, thereby forming aluminum wirings 17. Finally, a PSG (phosphoric silicon glass) film is deposited on the silicon oxide film 16 and the aluminum wirings 17.

In each JFET, the p-type diffused region 13 constitutes source and drain, and the p− ion implanted region 15 formed in the n− epitaxial layer 11 constitutes channel. Each aluminum wiring 17 constitutes a gate electrode and is formed on the channel surface through the thin silicon oxide film 16.

When the JFET 6a as well as the other JFETs is manufactured in the condition that the boron ion implantation is carried out at 100 KeV and $1.1 \times 10^{12}$ atoms/cm$^2$ and that the ratio of channel width W to channel length L, W/L, is set to be 0.1 and that the resistivity of the n− epitaxial layer is 1 Ω cm, the maximum saturation current $I_{DSS}$ of JFET 6a is about 0.3 μA and the temperature coefficient thereof is +1000 ppm/°C., which is desirable for a photo detector using a light emitting diode.

FIG. 4 shows another embodiment of the invention in which a hysteresis characteristics is added to the two-valued discrimination circuit of the foregoing embodiment. In this embodiment, a JFET constant current source 6f, an npn transistor 7d and a diode 8c are added to the circuit of FIG. 2. The added elements as well as the JFET 6a constitute another constant current source connected to the photo diode 1.

When a light-detecting electric current Ip flowing through the photo diode 1 is smaller than the current $I_{DSS}$, the JFET 6d and the npn transistor 7a are turned off so that the npn transistor 7d is turned off. In this case, the electric current flows through both JFETs 6a and 6f.

When each of the maximum saturation current of the JFETs 6a and 6f is equal to $I_{DSS}$ and the current Ip reaches 2$I_{DSS}$ and therefore reaches constant current regions of the JFETs 6a and 6f, the voltage at a point A is rapidly reduced. As a result, the npn transistors 7a and 7b are turned on and the npn transistor 7d is simultaneously turned on.

When the npn transistor 7d is turned on, the current flowing through the JFET 6f almost flows through the transistor 7d, and the current Ip almost flows through the JFET 6a. When the current Ip is smaller than the maximum saturation current $I_{DSS}$ of the JFET 6a, the voltage at point A is increased and the npn transistors 7a, 7b and 7d are turned off. Thus a hysteresis characteristics can be obtained in the embodiment shown in FIG. 4.

What is claimed is:
1. A semiconductor light detecting integrated circuit comprising:
  a. a light detecting element;
  b. a first constant current source including a first FET connected in series to a power source and to the light detecting element at a connecting point;
  c. a second constant current source including a second FET connected in parallel to said first FET, the second constant current source being connected to the power source and to the connecting point;
  d. circuit means, including a third FET the gate of which is connected to the connecting point, for providing a two-valued output signal based on the gate voltage at the connecting point, wherein the gate voltage varies in accordance with changes in the output current of the light detecting element and the two-valued output signal is indicative of whether the output current of the light detecting element reaches a predetermined level.

2. A semiconductor light detecting integrated circuit as set forth in claim 1 wherein the circuit means comprises a fourth and fifth FET, the sources of the third and fourth FETS being connected to the drain of the fifth FET, the drains of the third and fourth FETS being connected to first and second transistors that constitute a current mirror circuit, the gate and drain of the fourth FET be respectively connected to a diode that is connected to electrical ground and a third transistor that generates the two-valued output signal.

3. A semiconductor light detecting integrated circuit as set forth in claim 2 wherein the second constant current source comprises a fourth transistor connected to the second FET and the current mirror circuit, and a diode connected at a first end between the second FET and the fourth transistor and connected at a second end to the connection point.

* * * * *